United States Patent
Jin et al.

(10) Patent No.: US 9,319,033 B1
(45) Date of Patent: Apr. 19, 2016

(54) RAMP VOLTAGE GENERATOR AND METHOD FOR TESTING AN ANALOG-TO-DIGITAL CONVERTER

(71) Applicant: FREESCALE SEMICONDUCTOR, INC., Austin, TX (US)

(72) Inventors: Xiankun Jin, Austin, TX (US); Douglas A. Garrity, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/745,641

(22) Filed: Jun. 22, 2015

(51) Int. Cl.
*H03K 4/502* (2006.01)
*H03M 1/10* (2006.01)

(52) U.S. Cl.
CPC ............ *H03K 4/502* (2013.01); *H03M 1/1071* (2013.01)

(58) Field of Classification Search
CPC ............. H03M 1/1071–1/1095; H03K 4/502; H03H 19/004
USPC ......................................... 327/131–140, 554
See application file for complete search history.

(56) References Cited

U.S. PATENT DOCUMENTS

| | | | |
|---|---|---|---|
| 5,049,831 A | 9/1991 | Westwick | |
| 5,220,286 A | 6/1993 | Nadeem | |
| 7,129,734 B2 | 10/2006 | Geiger et al. | |
| 7,230,561 B2* | 6/2007 | Lee | H03K 4/50 341/144 |
| 7,477,100 B2 | 1/2009 | Ranganathan et al. | |
| 7,852,252 B2 | 12/2010 | Ge et al. | |
| 7,907,079 B1* | 3/2011 | Galloway | H03M 1/1014 341/155 |
| 8,089,302 B2 | 1/2012 | Louwsma et al. | |
| 8,198,937 B1 | 6/2012 | Vilas Boas et al. | |
| 8,344,798 B2 | 1/2013 | Garrity | |
| 8,400,339 B2 | 3/2013 | Garrity et al. | |
| 8,614,639 B1* | 12/2013 | Yin | H03M 1/56 341/144 |
| 8,803,569 B1* | 8/2014 | Malladi | H03K 4/066 327/131 |
| 8,922,261 B2 | 12/2014 | Zhang et al. | |
| 2012/0038809 A1 | 2/2012 | Lee et al. | |
| 2014/0055176 A1 | 2/2014 | Zhang et al. | |

OTHER PUBLICATIONS

G. Renaud et al., On-chip implementation of an integrator-based servo-loop for ADC static linearity test, Nov. 2014, IEEE, 2014 IEEE 23rd Asian Test Symposium, pp. 212-217.*
G. Renaud et al., Design of an on-chip stepwise ramp generator for ADC static BIST applications, Jun. 2015, IEEE, 2015 20th International Mixed-Signal Testing Workshop (IMSTW), pp. 1-6.*
Jin et al "Low-cost high-quality constant offset injection for SEIR-based ADC built-in-self-test", IEEE International Symposium on Circuits and Systems (ISCAS), Jun. 1-5, 2014, pp. 285-288, Melbourne VIC.
Lacerda et al, "A Differential Switched-Capacitor Amplifier with Programmable Gain and Output Offset Voltage", Freescale Semiconductor, Inc., Eintell5342, 2006, 5 pages.
Provost et al, "On-Chip Ramp Generators for Mixed-Signal BIST and ADC Self-Test", IEEE Journal of Solid-State Circuits, Feb. 2003, pp. 263-273, vol. 38, Issue 2.
Duan et al, "Cost effective signal generators for ADC BIST", IEEE International Symposium on Circuits and Systems, May 24-27, 2009, pp. 13-16, Taipei.

* cited by examiner

*Primary Examiner* — Howard Williams

(57) ABSTRACT

A method and circuit for generating ramped voltages are provided. The ramp voltage generator circuit includes: a switched-capacitor amplifier having an input terminal, an output terminal, a sampling capacitor switchably coupled to the input terminal, and a gain capacitor switchably coupled to the output terminal; and a current source having a terminal coupled to a supply terminal, and a terminal coupled to the input terminal. The ramp voltage generator circuit may be coupled to test an analog-to-digital converter (ADC).

19 Claims, 10 Drawing Sheets

RAMP VOLTAGE GENERATOR AND METHOD FOR TESTING AN ANALOG-TO-DIGITAL CONVERTER

BACKGROUND

1. Field

This disclosure relates generally to analog-to-digital converters, and more specifically, to a ramp voltage generator and method for testing an analog-to-digital converter (ADC).

2. Related Art

A major portion of the cost of manufacturing integrated circuits involves testing. For example, the cost of testing an analog-to-digital converter (ADC) is relatively high because specialized testing equipment may be required and because test time may be relatively long. Therefore, a need exists for a low-cost method for testing an ADC.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
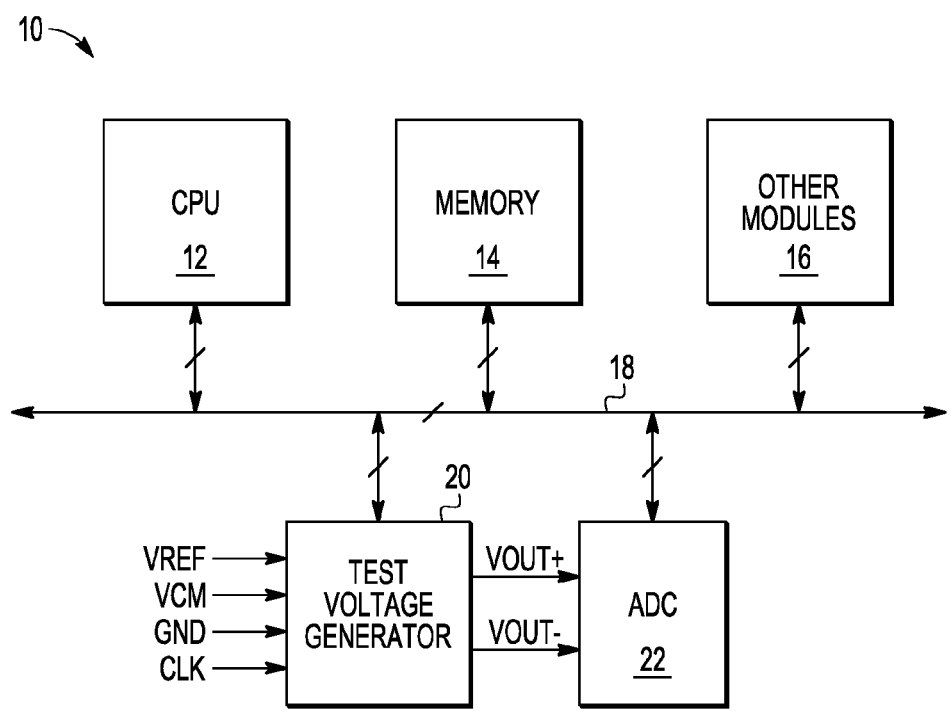
FIG. 1 illustrates, in block diagram form, a processing system in accordance with an embodiment.

Generally, there is provided, a ramp voltage generator for generating an analog input voltage that is ramped from one voltage level to another voltage level. The ramp voltage generator may be used for providing an input voltage for testing an ADC. The ramp voltage generator uses a switched current source on each input of the differential inputs of a fully differential switched capacitor amplifier. A constant offset circuit is used to provide a fixed reference for generating the input voltage. The use of a known constant offset allows a non-linear ramped input voltage to be used for generating the ramped output voltage. The ramped input voltage may be a ramp down, ramp up, or some other ramp scheme. The use of a non-linear ramped input voltage permits testing an ADC using an inexpensive signal generator because a highly linear ramp voltage is avoided, thus lowing testing costs of the ADC. The test voltage generator may be implemented on the same integrated circuit as the ADC, enabling the ability to test the ADC using only on-chip resources.

In one embodiment, there is provided, a ramp voltage generator comprising: a switched-capacitor amplifier having a first input terminal, a first output terminal, a first sampling capacitor having a first terminal switchably coupled to the first input terminal, and a first gain capacitor having a first terminal switchably coupled to the first output terminal; a first current source having a first terminal coupled to a first supply terminal, and a second terminal coupled to the first input terminal; a first switch having a first terminal coupled to a second supply terminal, and a second terminal coupled to the first terminal of the first sampling capacitor; a second switch having a first terminal coupled to the second supply terminal, and a second terminal coupled to a second terminal of the first sampling capacitor; and a third switch having a first terminal coupled to the second supply terminal, and a second terminal coupled to the first terminal of the first gain capacitor. The ramp voltage generator may further comprise a first offset generation circuit coupled to a second terminal of the first gain capacitor. The first offset generation circuit may include an offset capacitor switchably coupled to the first supply terminal and switchably coupled to the second supply terminal. The ramp voltage generator may further comprise a test control unit coupled to provide control signals to the switched-capacitor amplifier and to the first, second, and third switches. The switched-capacitor amplifier may be a differential switched-capacitor amplifier further comprising a second input terminal and a second output terminal, a second sampling capacitor having a first terminal switchably coupled to the second input terminal, and a second gain capacitor having a first terminal switchably coupled to the second output terminal, and wherein the ramp voltage generator may further comprise: a second current source having a first terminal coupled to a third supply terminal, and a second terminal coupled to the second input terminal; a fourth switch having a first terminal coupled to a second supply terminal, and a second terminal coupled to the first terminal of the second sampling capacitor; a fifth switch having a first terminal coupled to the second supply terminal, and a second terminal coupled to a second terminal of the second sampling capacitor; and a sixth switch having a first terminal coupled to the second supply terminal, and a second terminal coupled to the first terminal of the first gain capacitor. The ramp voltage generator may further comprise a first offset generation circuit coupled to a second terminal of the first gain capacitor and a second offset generation circuit coupled to a second terminal of the second gain capacitor. The first offset generation circuit may include a first offset capacitor switchably coupled to the first supply terminal and switchably coupled to the second supply terminal, and wherein the second offset generation circuit includes a second offset capacitor switchably coupled to the second supply terminal and switchably coupled to the third supply terminal. The ramp voltage generator may further comprise a test control unit coupled to provide control signals to the differential switched-capacitor amplifier and to the first, second, third, fourth, fifth, and sixth switches. A system may comprise an analog-to-digital converter (ADC) having differential input terminals coupled to the first and second output terminals of the differential switched-capacitor amplifier of the ramp voltage generator.

In another embodiment, there is provided, ramp voltage generator comprising: a first current source having a first terminal coupled to a first supply terminal, and a second terminal; a first switch having a first terminal coupled to the second terminal of the first current source, and a second terminal; a second switch having a first terminal coupled to a second supply terminal, and a second terminal coupled to the second terminal of the first switch; a third switch having a first terminal coupled to the second supply terminal, and a second terminal; a fourth switch having a first terminal and a second terminal; a first capacitor having a first terminal coupled to the second terminal of the first switch, and a second terminal coupled to the second terminal of the third switch; a second capacitor having a first terminal coupled to the second terminal of the first capacitor, and a second terminal coupled to the first terminal of the fourth switch; and an amplifier having a first input coupled to the second terminal of the first capacitor, and a first output coupled to the second terminal of the fourth switch. The ramp voltage generator may further comprise an offset generation circuit coupled to the first input of the second capacitor. The offset generation circuit may include: a fifth switch having a first terminal coupled to the first supply terminal, and a second terminal; a sixth switch having a first terminal coupled to the second supply terminal, and a second terminal coupled to the second terminal of the first switch; and a third capacitor having a first terminal coupled to the second terminal of the fifth switch and to the sixth switch, and a second terminal coupled to the first terminal coupled to the first terminal of the second capacitor. The ramp voltage generator may further comprise a test control unit coupled to provide test control signals to the first, second, third, and fourth switches. The ramp voltage generator may further comprise: a seventh switch having a first terminal coupled to the first input of the amplifier, and a second terminal coupled to the first output of the amplifier; and a eighth switch having a first terminal coupled to the second supply terminal, and a second terminal coupled to the second terminal of the second capacitor. The amplifier may be a differential amplifier further comprising a second input and a second output, and the ramp voltage generator may further comprise: a second current source having a first terminal coupled to a third supply terminal, and a second terminal; a ninth switch having a first terminal coupled to the second terminal of the second current source, and a second terminal; a tenth switch having a first terminal coupled to the second supply terminal, and a second terminal coupled to the second terminal of the ninth switch; a eleventh switch having a first terminal coupled to the second supply terminal, and a second terminal; a twelfth switch having a first terminal coupled to the second output of the amplifier and a second terminal; a fourth capacitor having a first terminal coupled to the second terminal of the ninth switch, and a second terminal coupled to the second terminal of the eleventh switch and to the second input of the amplifier; and a fifth capacitor having a first terminal coupled to the second terminal of the fourth capacitor, and a second terminal coupled to the second terminal of the twelfth switch. The ramp voltage generator may further comprise a test control unit coupled to provide control signals to the differential amplifier and to the first through twelfth switches. A system for testing an analog-to-digital converter (ADC) may comprise a differential ADC having differential input terminals coupled to the first and second output terminals of the differential amplifier of the ramp voltage generator.

In yet another embodiment, there is provided, a method for generating a ramped voltage, the method performed in a ramp voltage generator circuit including an output terminal, a current source, a first capacitor, a second capacitor, and an amplifier having a first input and a first output, the method comprising: during a first phase having a first configuration of a plurality of switches, charging the first capacitor using the current source; and during a second phase having a second configuration of the plurality of switches, transferring charge from the first capacitor to the second capacitor such that a change in charge at the second capacitor causes a first predetermined voltage change at the output terminal. The ramp voltage generator circuit may further include an offset generation circuit, and the method may further comprise: during a third phase having a third configuration of the plurality of switches, transferring charge from the offset generation circuit to the second capacitor such that a change in charge at the second capacitor causes a second predetermined voltage change at the output terminal. The method may further comprise coupling signals from a test control unit to the plurality of switches to configure the plurality of switches.

FIG. 1 illustrates, in block diagram form, processing system 10 in accordance with an embodiment. Processing system 10 includes central processing unit (CPU) 12, memory 14, other modules 16, ramp voltage generator 20, and ADC 22, all bi-directionally coupled to bus 18. Processing system 10 may be implemented on a single integrated circuit. Bus 12 can be any type of bus for communicating any type of information such as data, address, or instructions. Central processing unit 12 may be any type of microprocessor (MPU), microcontroller (MCU), digital signal processor (DSP), or other type of processing core. There may be multiple processors like CPU 12. Memory 14 may be shared between the modules of FIG. 1 or between multiple processors. Memory 14 may be any type of volatile or non-volatile memory, such as static random access memory (SRAM), dynamic random access memory (DRAM), flash, etc. Other modules 16 may include circuits for providing specific functionally to processing system 10, such as for example, additional memories, a direct memory access (DMA) controller, a debug module, arbitration circuits, power management circuits, communication circuits, etc. Analog-to-digital converter 22 is a conventional ADC that receives an analog input voltage and converts the analog input voltage to a digital code. Analog-to-digital converter 22 may be one of the many types of analog-to-digital converters, such as for example, a sigma-delta ADC, a flash ADC, or a successive-approximation ADC.

Analog-to-digital converter (ADC) 22 may be tested using ramp voltage generator 20. Ramp voltage generator 20 has inputs for receiving a reference voltage labeled "VREF", a common mode voltage labeled "VCM", a ground potential labeled "GND", and a clock signal labeled "CLK". Also, ramp voltage generator 20 has differential outputs for providing output voltages labeled "VOUT+" and "VOUT−". The differential outputs are coupled to a differential input of ADC 22 to provide a ramped input voltage for testing ADC 22. Ramp voltage generator 20 will be described in more detail below.

Figure 2:
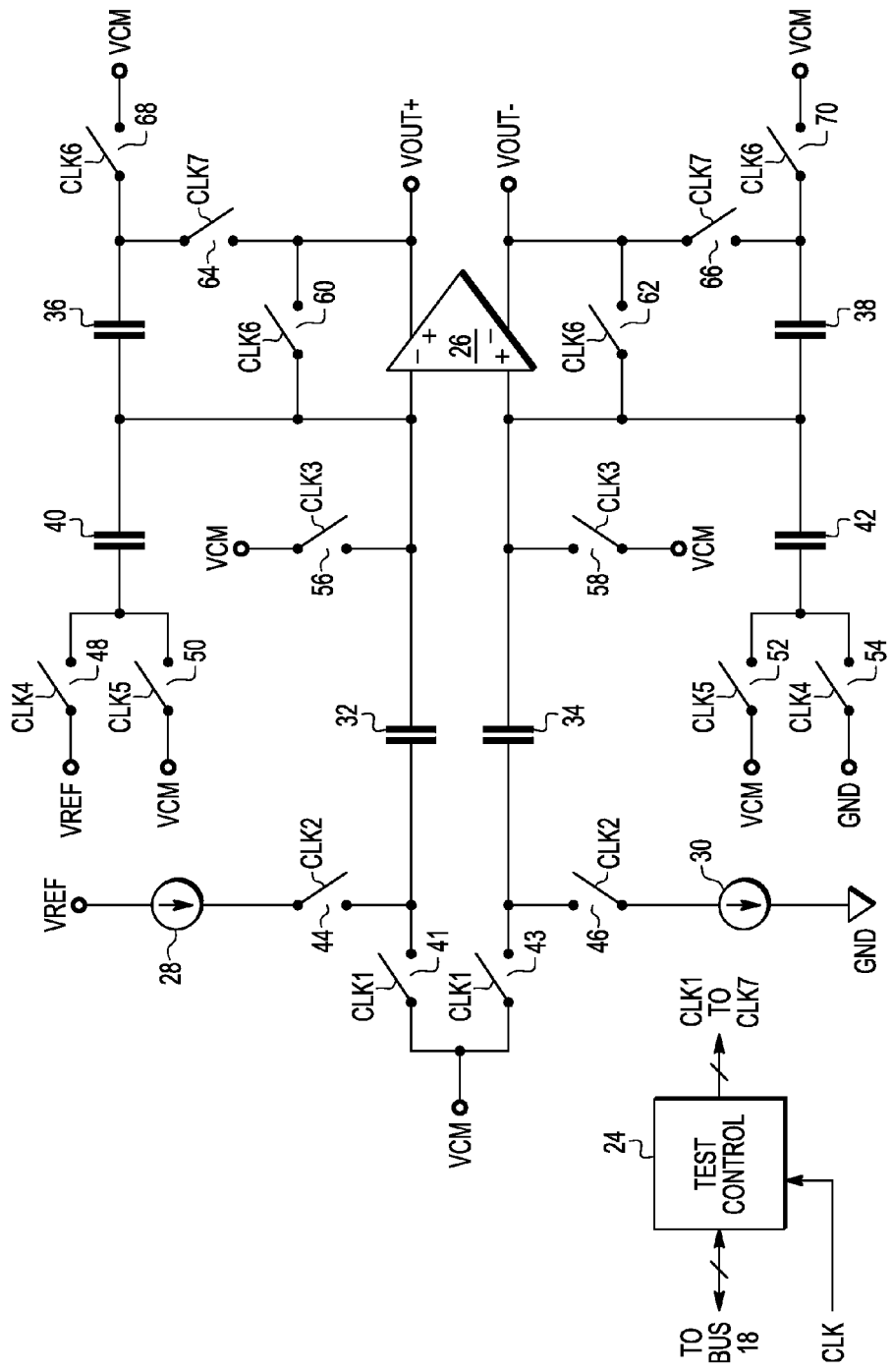
FIG. 2 illustrates, in partial schematic diagram form and partial block diagram form, the test voltage generator of the processing system of FIG. 1.

FIG. 2 illustrates, in partial schematic diagram form and partial block diagram form, ramp voltage generator 20 of processing system 10 of FIG. 1 in more detail. Ramp voltage generator 20 includes test control 24, fully differential switched-capacitor amplifier 26, current sources 28 and 30, capacitors 32, 34, 36, 38, 40, and 42, and switches 41, 43, 44, 46, 48, 50, 52, 54, 56, 58, 60, 62, 64, 66, 68, and 70. Because amplifier 26 has differential inputs and differential outputs, the components coupled to amplifier 26 are mirrored on the top and bottom halves of the circuit illustrated in FIG. 2. Test control 24 is bi-directionally connected to bus 18, has an input for receiving clock signal CLK, and outputs for providing clock signals labeled "CLK 1" to "CLK 7" to switches of ramp voltage generator 20. Clock signal CLK may be generated externally or generated internally in processing system 10. Also, clock signal CLK does not have to be provided via bus 18, but may be generated in test control 24. Differential amplifier 26 has differential positive and negative inputs and outputs and is characterized as having a relatively high open loop gain. The negative input of amplifier 26 is connected to one terminal of capacitor 32 and the positive input is connected to a terminal of capacitor 34. The second terminal of capacitor 32 is connected to a first terminal of switch 41 and the second terminal of capacitor 34 is connected to a first terminal of switch 43. The second terminals of switches 41 and 43 are connected together for receiving common mode VCM. Control terminals of switches 41 and 43 are connected to receive clock signals CLK 1. In one embodiment, VCM is set to be about half way between a logic high and a logic low of the output voltages VOUT+ and VOUT−. Current source 28 has a first terminal connected to a reference voltage terminal for receiving reference voltage VREF, and a second terminal connected to the first terminal of switch 44. A second terminal of switch 44 is connected to the second terminal of capacitor 32, and a control terminal of switch 44 is connected to receive clock signal CLK 2. Reference voltage VREF is a regulated voltage and may be equal to about a supply voltage. Current source 30 has a first terminal connected to ground, and a second terminal connected to a first terminal of switch 46. Switch 46 has a second terminal connected to the second terminal of capacitor 34, and a control terminal connected to receive clock signal CLK 2. Switch 48 has a first terminal connected to receive VREF, a control terminal connected to receive CLK 4, and a second terminal. Switch 50 has a first terminal connected to receive VCM, a control terminal connected to receive clock signal CLK 5, and a second terminal connected to the second terminal of switch 48. Capacitor 40 has a first terminal connected to the second terminals of switches 48 and 50, and a second terminal connected to the negative input terminal of amplifier 26. Switch 52 has a first terminal connected to VCM, a second terminal, and a control terminal for receiving clock signal CLK 5. Switch 54 has a first terminal connected to ground, a second terminal connected to the second terminal of switch 52, and a control terminal for receiving clock signal CLK 4. Capacitor 42 has a first terminal connected to the second terminals of switches 52 and 54, and a second terminal connected to the positive input of amplifier 26. Switch 56 has a first terminal connected to VCM, a control terminal connected to receive clock signal CLK 3, and a second terminal connected to the negative input terminal of amplifier 26. Switch 58 has a first terminal connected to the positive input of amplifier 26, a control terminal for receiving clock signal CLK 3, and a second terminal connected to receive VCM. Capacitor 36 has a first terminal connected to the negative input of amplifier 26, and a second terminal. Capacitor 38 has a first terminal connected to the positive input of amplifier 26, and a second terminal. Switch 60 has a first terminal connected to the negative input of amplifier 26, a control terminal for receiving clock signal CLK 6, and a second terminal connected to the positive output terminal of amplifier 26. Switch 62 has a first terminal connected to the positive input of amplifier 26, a control terminal for receiving clock signal CLK 6, and a second terminal connected to the negative output terminal of amplifier 26. Switch 64 has a first terminal connected to the second terminal of capacitor 36, a control terminal connected to receive clock signal CLK 7, and a second terminal connected to the positive output terminal of amplifier 26. Switch 66 has a first terminal connected to the second terminal of capacitor 38, a control terminal connected to receive clock signal CLK 7, and a second terminal connected to the negative output terminal of amplifier 26. Switch 68 has a first terminal connected to the second terminal of capacitor 36, a control terminal connected to receive clock signal CLK 6, and a second terminal connected to receive VCM. Switch 70 has a first terminal connected to the second terminal of capacitor 38, a control terminal connected to receive clock signal CLK 6, and a second terminal connected to receive VCM.

FIG. 3 through FIG. 9 illustrates the phases of an operating cycle for generating a test voltage using ramp voltage generator 20 in accordance with an embodiment. FIG. 10 illustrates the output voltage of the test voltage generator for each of the phases during one the operating cycle. The illustrated embodiment includes, in order, an initialization phase, a first sampling phase, a first amplification phase without offset, a first amplification phase with offset, a second sampling phase, a second amplification phase with offset, and finally a second amplification phase without offset. Other embodiments may change or re-order the illustrated phases. The phases are illustrated in FIG. 10 as time periods between tick marks. The differential output voltage VOUT+/VOUT− ramps up in the illustrated embodiment, but may ramp, or transition, differently in another embodiment.

Generally, current sources/sinks 28 and 30 are used to charge/discharge capacitors 32 and 34 to provide a small step of voltage change on differential output voltage VOUT+/VOUT−. Gain capacitors 36 and 38 are used as charge pumping capacitors and the voltage on capacitors 32 and 34 is relatively constant at about the level of VCM. Therefore, a drain/source voltage shift of the current sources does not cause a non-linearity problem. The size of capacitors 36 and 38 determines a resolution of the ramp rate of the analog input voltage. Because capacitors 32 and 34 do not affect the ramp rate, they can have a relatively small capacitance value. Capacitors 40 and 42 are used to provide the constant offset voltage. The amplification phases are arranged alternately without offset/with offset to remove the impact of temperature changes.

Figure 3:
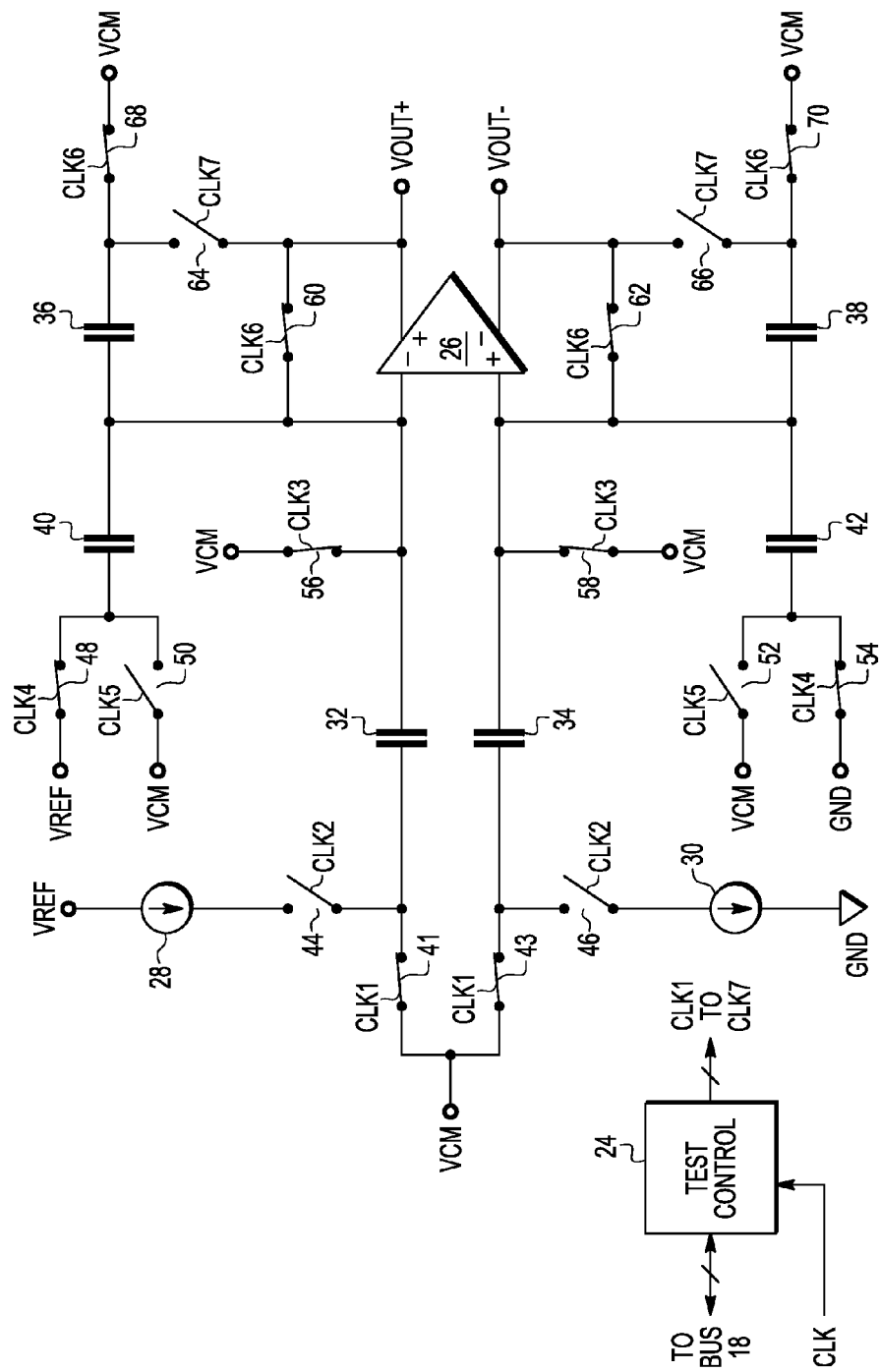
FIG. 3 through FIG. 9 illustrates the phases of an operating cycle for generating a test voltage using the test voltage generator of FIG. 2 in accordance with an embodiment.

FIG. 3 illustrates ramp voltage generator 20 during an initialization phase (PH 0). Test control 24 provides clock signals CLK 1 through CLK 7 to configure the switches of ramp voltage generator 20 so that switches 41, 43, 48, 54, 56, 58, 60, 62, 68, and 70 are closed, or conductive, and switches 44, 46, 50, 52, 64, and 66 are open, or non-conductive for the entire phase. With the switches configured this way, capacitors 32, 34, 36, 38, 40 and 42 are charged to common mode voltage VCM and the differential inputs and differential outputs of amplifier 26 are all charged to common mode voltage VCM. In one embodiment, common mode voltage VCM is about half-way between positive power supply voltage VREF and ground GND. If reference voltage VREF is 3.0 volts and ground is zero volts, then common mode voltage VCM is about 1.5 volts. FIG. 10 illustrates output voltage VOUT+/VOUT− at an initial voltage V1 during initialization phase PH 0. Note that FIG. 10 is representing the differential output voltage VOUT+/VOUT− as a single-ended voltage for simplicity of illustration.

Figure 4:
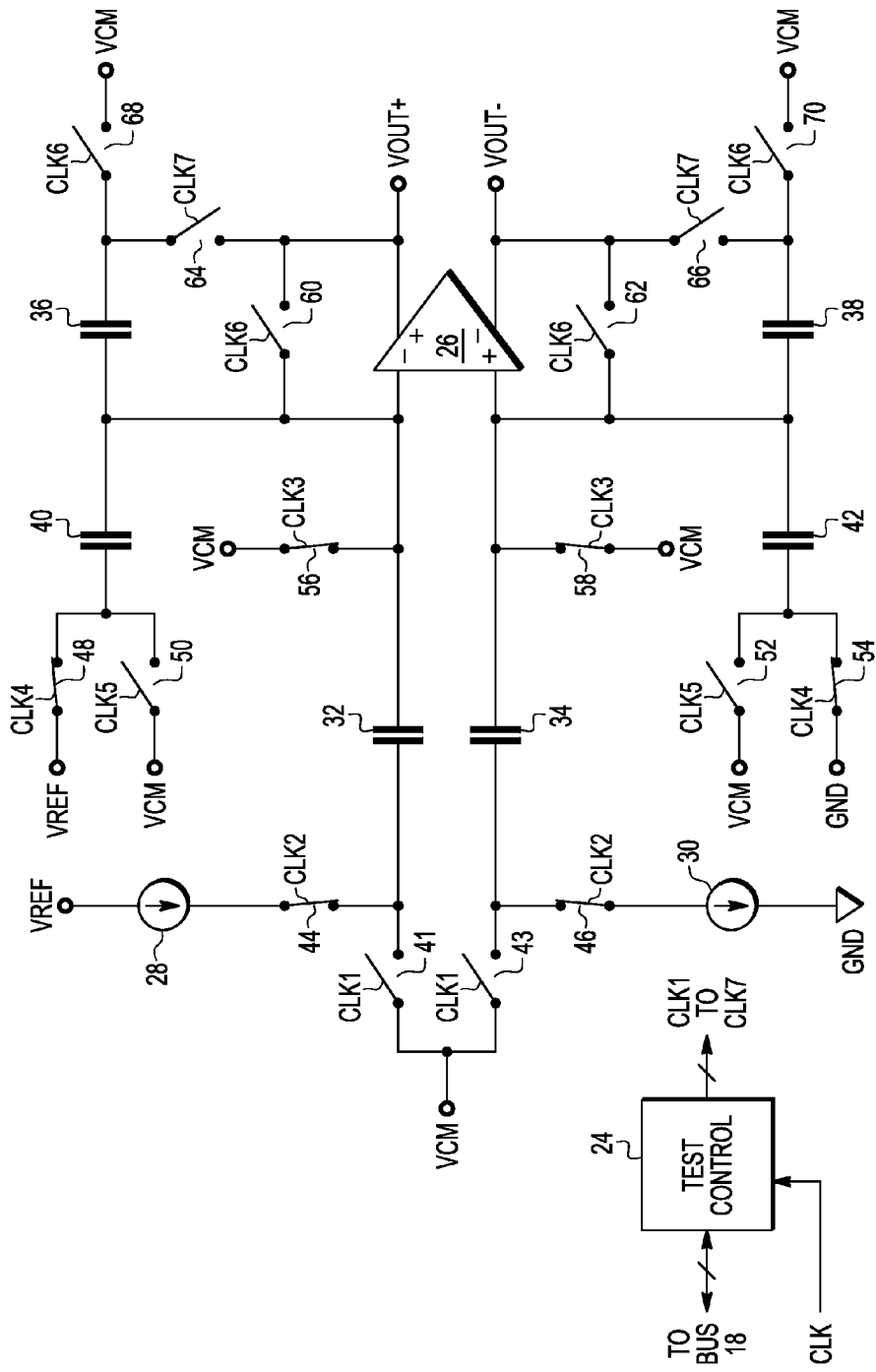

FIG. 4 illustrates the switch configuration of ramp voltage generator 20 during first sampling phase PH 1. During the first sampling phase PH 1, test control 24 provides clock signals CLK 1 through CLK 7 to configure the switches of ramp voltage generator 20 so that switches 44, 46, 48, 54, 56, and 58 are closed while all of the other switches are open. In this switch configuration, referring to the top half of ramp voltage generator 20, current source 28 provides voltage VREF to the first terminal of capacitor 32 through switch 44 while switch 56 connects common mode voltage VCM to the second terminal of capacitor 32 and the first terminal of capacitor 36. Voltage VREF is applied to the first terminal of capacitor 40 through switch 48. At the bottom half of ramp voltage generator 20, current source 30 connects ground terminal GND to the first terminal of capacitor 34 through switch 46 while switch 58 connects common mode voltage VCM to the second terminal of capacitor 34 and the first terminal of capacitor 48. Switch 54 connects ground terminal GND to the first terminal of capacitor 42. A charge stored on capacitors 40 and 42 is added to the charge on capacitors 36 and 38. Capacitors 32 and 34 function as sampling capacitors. Capacitors 36 and 38 function to provide gain. A step size of the voltage increase at the output terminals of amplifier 26 is determined by a relative size of capacitor 40 and capacitor 36. In one embodiment capacitor 40 is one-tenth the size of capacitor 36. Amplifier 26 is characterized as having a high open loop gain.

Figure 5:
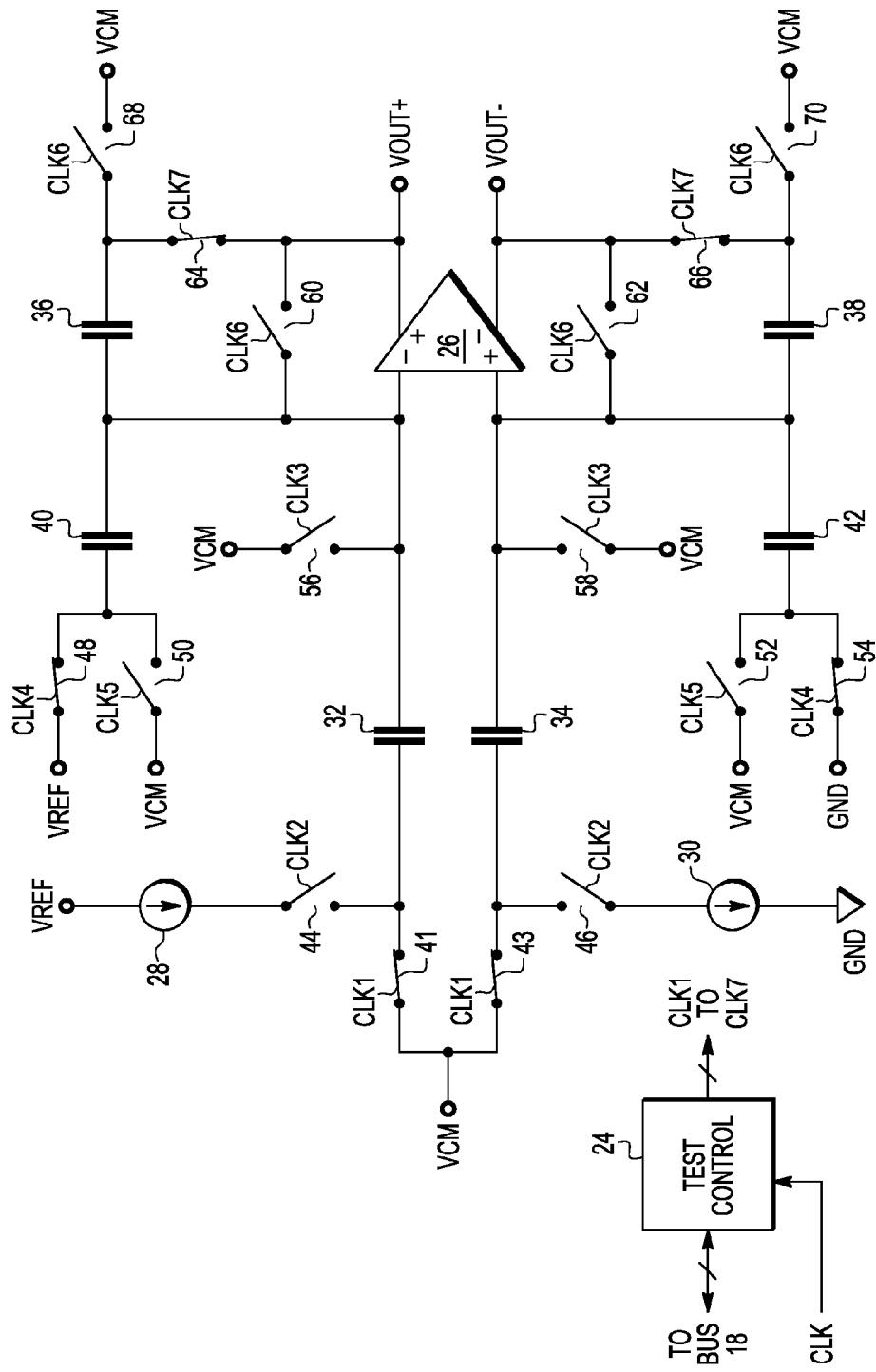

FIG. 5 illustrates the switch configuration of ramp voltage generator 20 during amplification phase PH 2 without applying an offset voltage. During amplification phase PH 2, test control 24 provides clock signals CLK 1 through CLK 7 to configure the switches of ramp voltage generator 20 to close switches 41, 43, 48, 54, 64, and 66. The other switches are open. A differential voltage at the output of amplifier 26 is amplified voltage V2 without a voltage offset as illustrated in FIG. 10 at phase PH 2.

Figure 6:
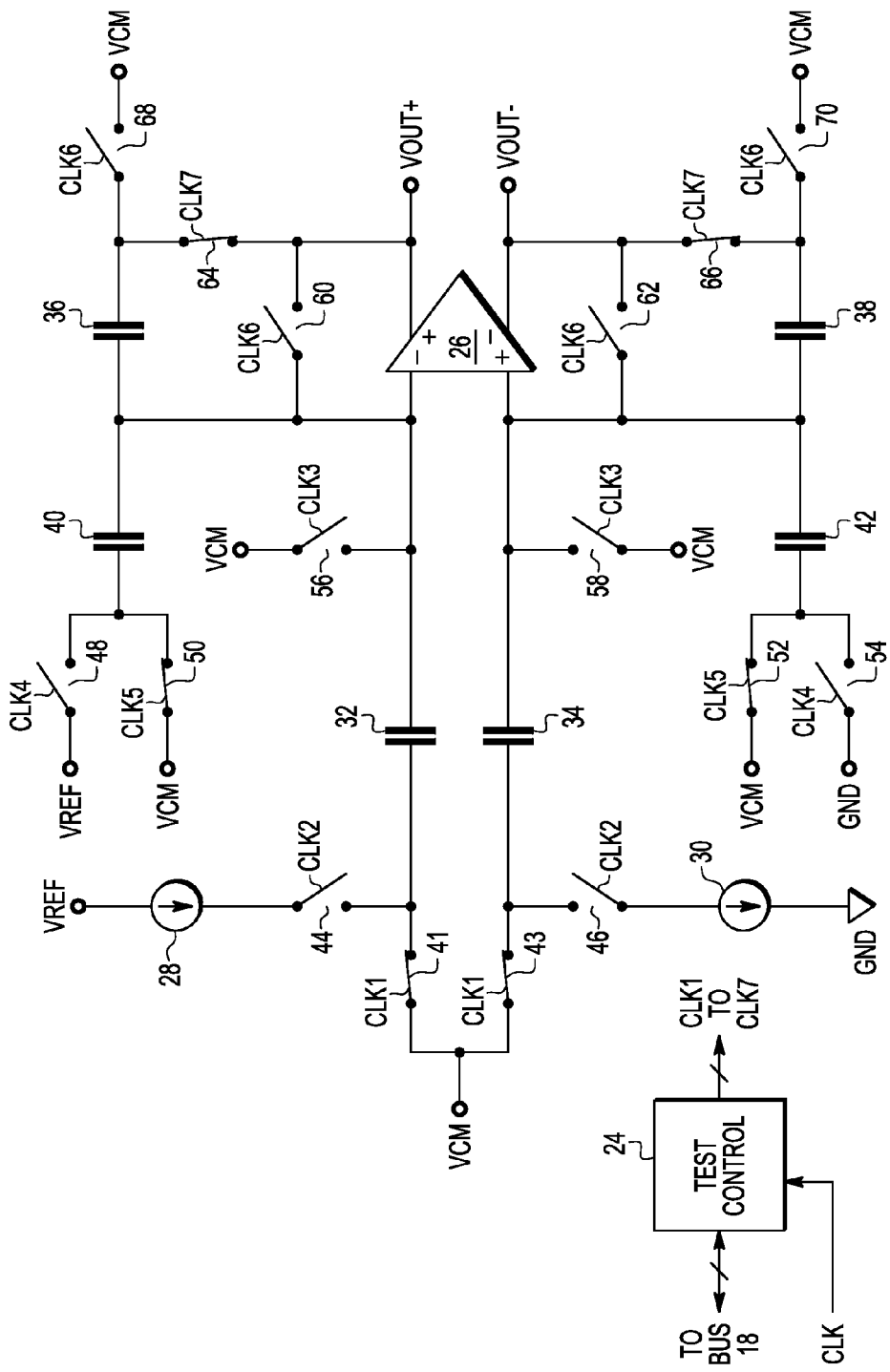

FIG. 6 illustrates the switch configuration of ramp voltage generator 20 during amplification phase PH 3 while applying the offset. During amplification phase PH 2, test control 24 causes switches 41, 43, 50, 52, 64, and 66 to be closed. The other switches are open. Differential signals VOUT+/VOUT− are amplified with a voltage offset. Charge is transferred from the offset generation circuit, that includes switches 48 and 50 and capacitor 40, to capacitor 36 such that a change in charge at capacitor 36 causes a predetermined voltage change at the output terminal of amplifier 26. The same charge transfer will occur at the bottom half of ramp voltage generator 20 with gain capacitor 38. Capacitors 40 and 42, when switches 50 and 52 are closed, provide the voltage offset to gain capacitors 36 and 38. The voltage is illustrated in FIG. 10 as voltage V3 at phase PH 3.

Figure 7:
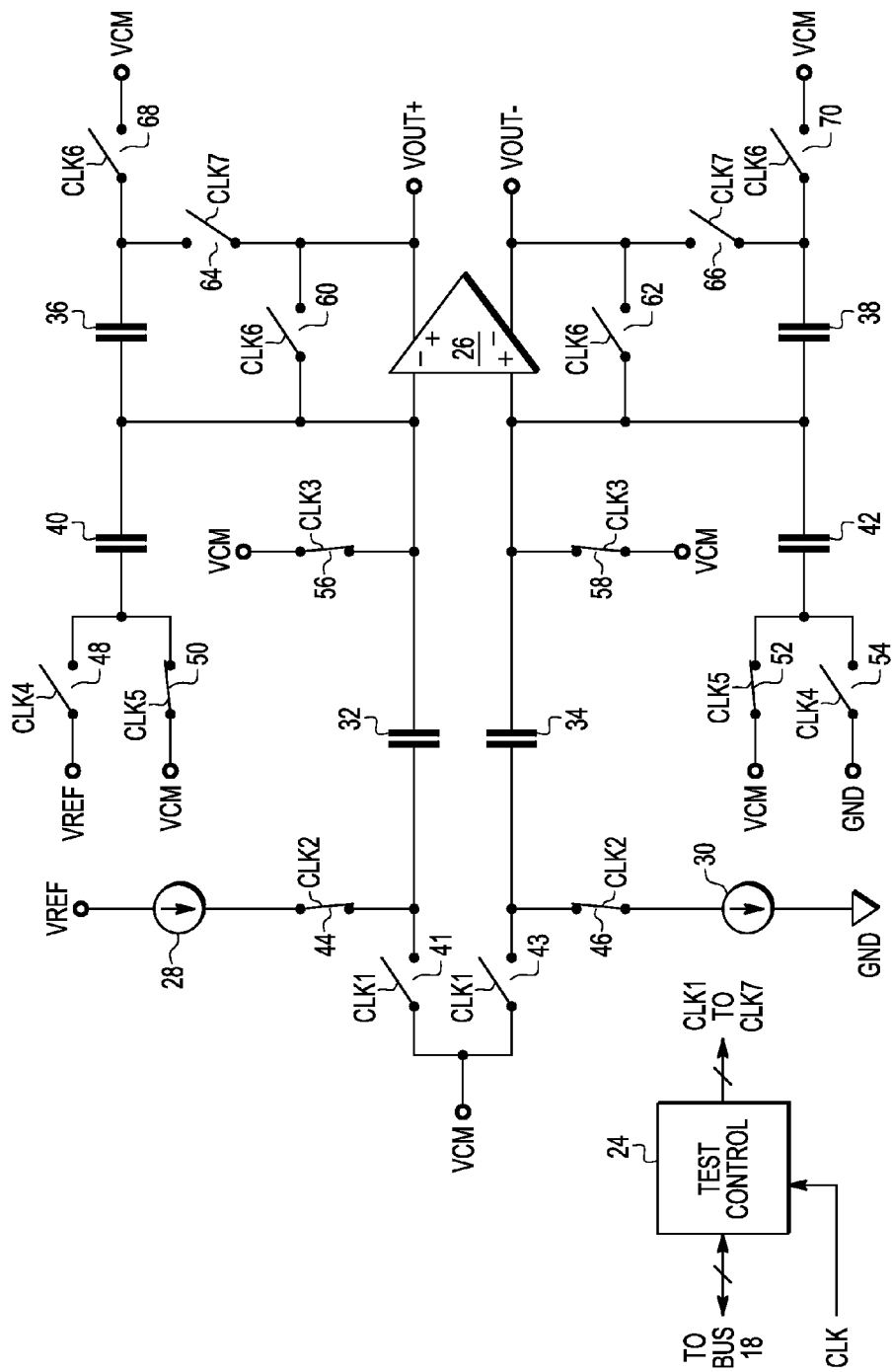

FIG. 7 illustrates the switch configuration of ramp voltage generator 20 during second sampling phase PH 4. During the second sampling phase PH 4, switches 44, 46, 50, 52, 56, and 58 are closed and the rest of the switches are open. The output voltage VOUT+/VOUT− does not change and is still at voltage V3 during phase PH 4 in FIG. 10.

Figure 8:
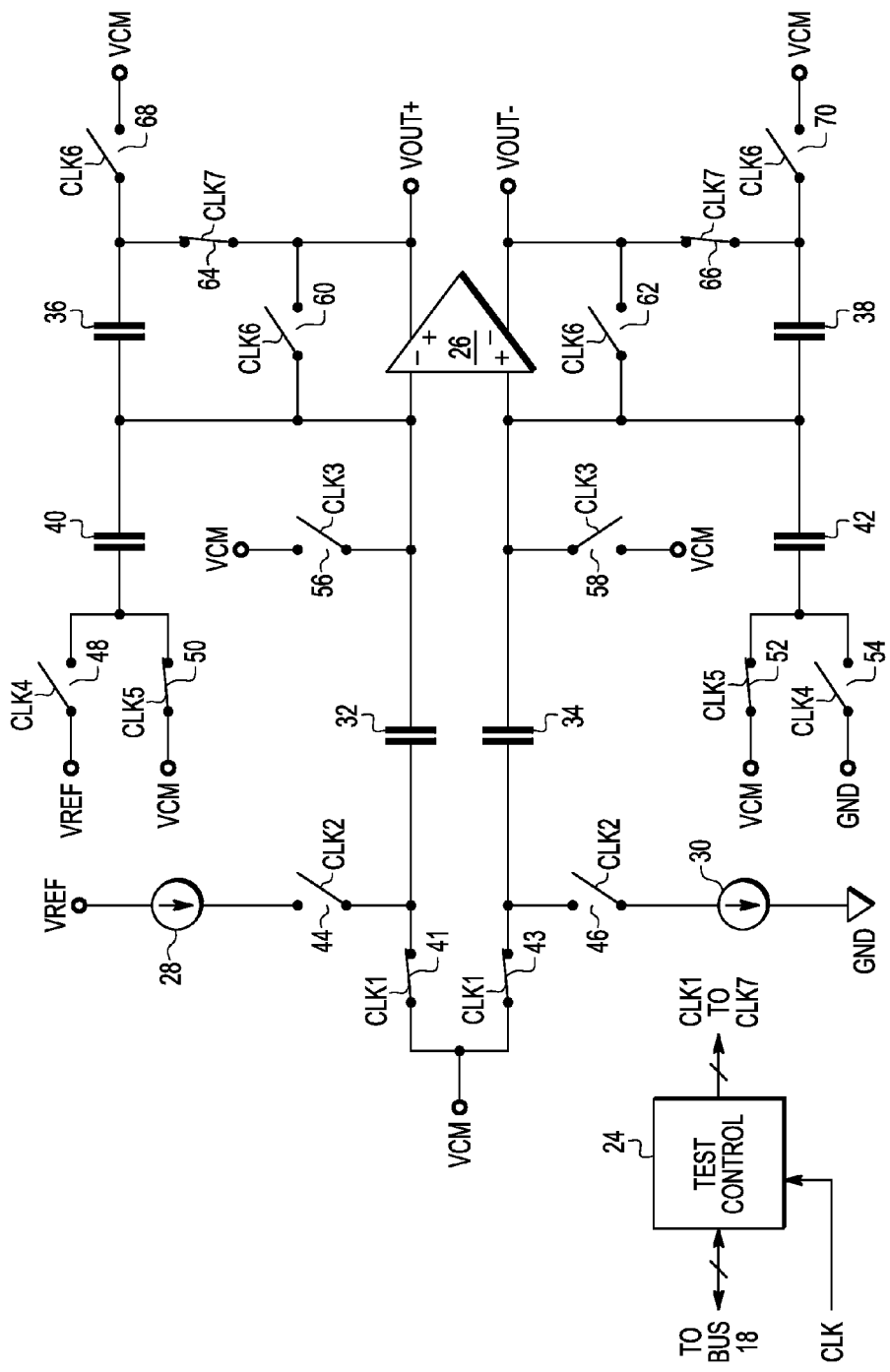

FIG. 8 illustrates the switch configuration of ramp voltage generator 20 during an amplification phase PH 5 with offset voltage. During phase PH 5 switches 41, 43, 50, 52, 64, and 66 are closed causing amplification of the differential output voltage VOUT+/VOUT− with a voltage offset. The differential output voltage is at level V4 at phase PH 5 in FIG. 10.

Figure 9:
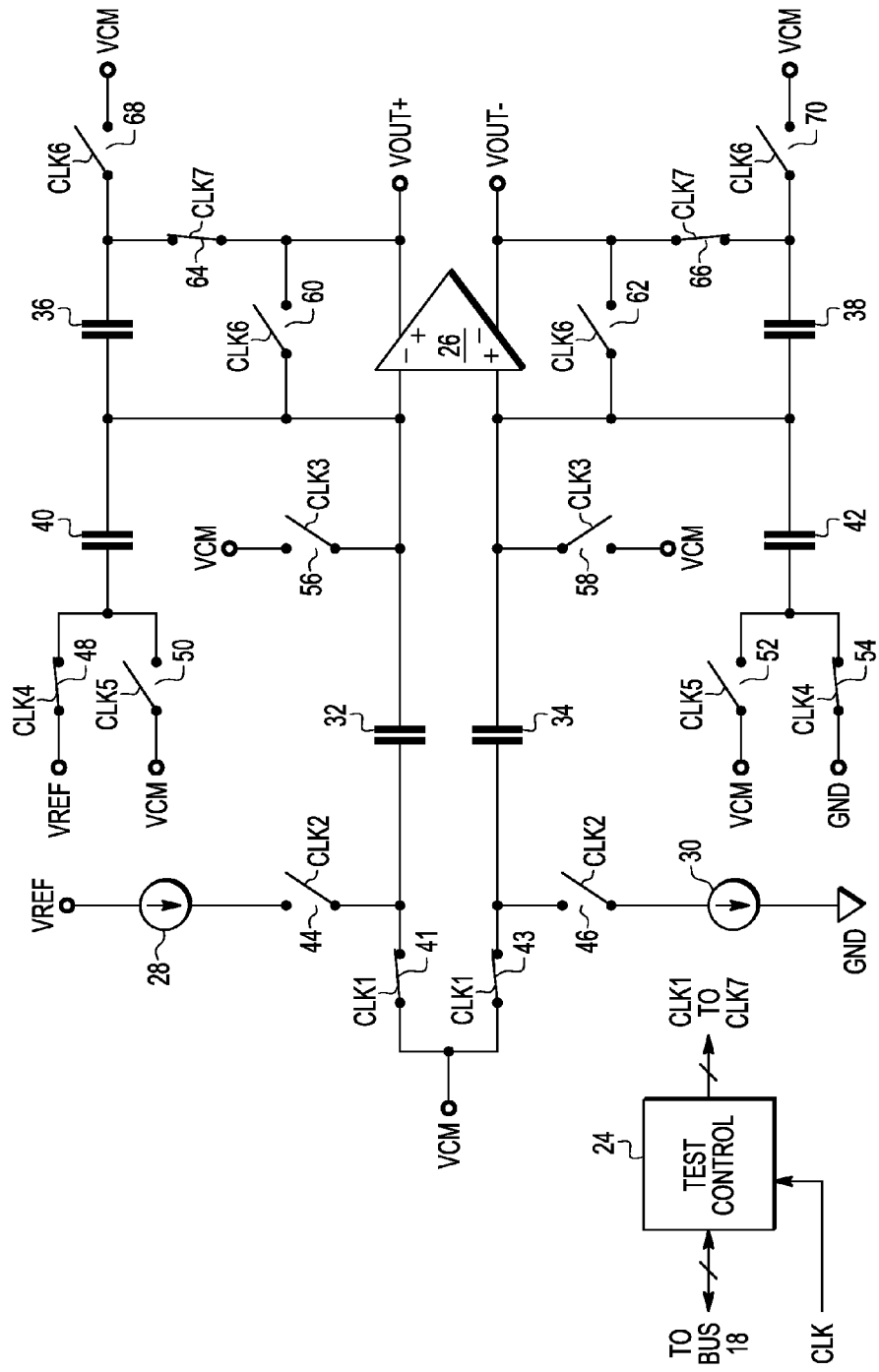
Figure 10:
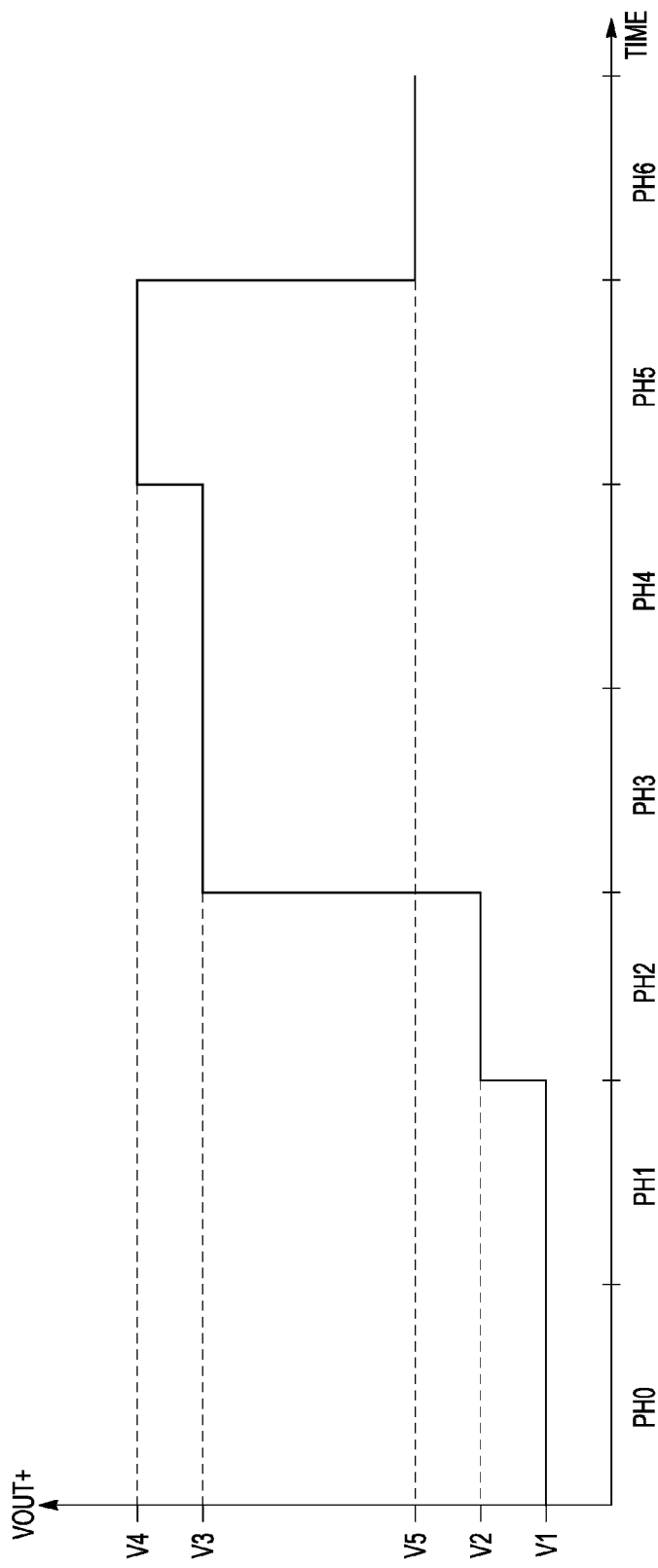
FIG. 10 illustrates the output voltage of the test voltage generator for one operating cycle.

FIG. 9 illustrates the switch configuration of ramp voltage generator 20 during amplification phase PH 6 without offset voltage. During phase PH 6 switches 41, 43, 48, 54, 64, and 66 are closed. The other switches are open. The differential output voltage VOUT+/VOUT− is amplified without a voltage offset. The differential output voltage is at level V5 at phase PH 6 in FIG. 10.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A ramp voltage generator comprising:
   a switched-capacitor amplifier having a first input terminal, a first output terminal, a first sampling capacitor having a first terminal switchably coupled to the first input terminal, and a first gain capacitor having a first terminal switchably coupled to the first output terminal;
   a first current source having a first terminal coupled to a first supply terminal, and a second terminal coupled to the first input terminal;
   a first switch having a first terminal coupled to a second supply terminal, and a second terminal coupled to the first terminal of the first sampling capacitor;
   a second switch having a first terminal coupled to the second supply terminal, and a second terminal coupled to a second terminal of the first sampling capacitor; and
   a third switch having a first terminal coupled to the second supply terminal, and a second terminal coupled to the first terminal of the first gain capacitor.

2. The ramp voltage generator of claim 1, further comprising a first offset generation circuit coupled to a second terminal of the first gain capacitor.

3. The ramp voltage generator of claim 2, wherein the first offset generation circuit includes an offset capacitor switchably coupled to the first supply terminal and switchably coupled to the second supply terminal.

4. The ramp voltage generator of claim 1, further comprising a test control unit coupled to provide control signals to the switched-capacitor amplifier and to the first, second, and third switches.

5. The ramp voltage generator of claim 1, wherein the switched-capacitor amplifier is a differential switched-capacitor amplifier further comprising a second input terminal and a second output terminal, a second sampling capacitor having a first terminal switchably coupled to the second input terminal, and a second gain capacitor having a first terminal switchably coupled to the second output terminal, and wherein the ramp voltage generator further comprises:
   a second current source having a first terminal coupled to a third supply terminal, and a second terminal coupled to the second input terminal;
   a fourth switch having a first terminal coupled to a second supply terminal, and a second terminal coupled to the first terminal of the second sampling capacitor;
   a fifth switch having a first terminal coupled to the second supply terminal, and a second terminal coupled to a second terminal of the second sampling capacitor; and
   a sixth switch having a first terminal coupled to the second supply terminal, and a second terminal coupled to the first terminal of the first gain capacitor.

6. The ramp voltage generator of claim 5, further comprising a first offset generation circuit coupled to a second terminal of the first gain capacitor and a second offset generation circuit coupled to a second terminal of the second gain capacitor.

7. The ramp voltage generator of claim 6, wherein the first offset generation circuit includes a first offset capacitor switchably coupled to the first supply terminal and switchably coupled to the second supply terminal, and wherein the second offset generation circuit includes a second offset capacitor switchably coupled to the second supply terminal and switchably coupled to the third supply terminal.

8. The ramp voltage generator of claim 5, further comprising a test control unit coupled to provide control signals to the differential switched-capacitor amplifier and to the first, second, third, fourth, fifth, and sixth switches.

9. A system comprising an analog-to-digital converter (ADC) having differential input terminals coupled to the first and second output terminals of the differential switched-capacitor amplifier of the ramp voltage generator of claim 5.

10. A ramp voltage generator comprising:
    a first current source having a first terminal coupled to a first supply terminal, and a second terminal;
    a first switch having a first terminal coupled to the second terminal of the first current source, and a second terminal;
    a second switch having a first terminal coupled to a second supply terminal, and a second terminal coupled to the second terminal of the first switch;
    a third switch having a first terminal coupled to the second supply terminal, and a second terminal;
    a fourth switch having a first terminal and a second terminal;
    a first capacitor having a first terminal coupled to the second terminal of the first switch, and a second terminal coupled to the second terminal of the third switch;
    a second capacitor having a first terminal coupled to the second terminal of the first capacitor, and a second terminal coupled to the first terminal of the fourth switch; and
    an amplifier having a first input coupled to the second terminal of the first capacitor, and a first output coupled to the second terminal of the fourth switch.

11. The ramp voltage generator of claim 10, further comprising an offset generation circuit coupled to the first input of the second capacitor.

12. The ramp voltage generator of claim 11, wherein the offset generation circuit includes:
    a fifth switch having a first terminal coupled to the first supply terminal, and a second terminal;
    a sixth switch having a first terminal coupled to the second supply terminal, and a second terminal coupled to the second terminal of the first switch; and
    a third capacitor having a first terminal coupled to the second terminal of the fifth switch and to the sixth switch, and a second terminal coupled to the first terminal coupled to the first terminal of the second capacitor.

13. The ramp voltage generator of claim 10, further comprising a test control unit coupled to provide test control signals to the first, second, third, and fourth switches.

14. The ramp voltage generator of claim 10, further comprising:
    a seventh switch having a first terminal coupled to the first input of the amplifier, and a second terminal coupled to the first output of the amplifier; and
    a eighth switch having a first terminal coupled to the second supply terminal, and a second terminal coupled to the second terminal of the second capacitor.

15. The ramp voltage generator of claim 10, wherein the amplifier is a differential amplifier further comprising a second input and a second output, and wherein the ramp voltage generator further comprises:
    a second current source having a first terminal coupled to a third supply terminal, and a second terminal;
    a ninth switch having a first terminal coupled to the second terminal of the second current source, and a second terminal;
    a tenth switch having a first terminal coupled to the second supply terminal, and a second terminal coupled to the second terminal of the ninth switch;
    a eleventh switch having a first terminal coupled to the second supply terminal, and a second terminal;
    a twelfth switch having a first terminal coupled to the second output of the amplifier and a second terminal;
    a fourth capacitor having a first terminal coupled to the second terminal of the ninth switch, and a second terminal coupled to the second terminal of the eleventh switch and to the second input of the amplifier; and
    a fifth capacitor having a first terminal coupled to the second terminal of the fourth capacitor, and a second terminal coupled to the second terminal of the twelfth switch.

16. The ramp voltage generator of claim 15, further comprising a test control unit coupled to provide control signals to the differential amplifier and to the first through twelfth switches.

17. A system for testing an analog-to-digital converter (ADC) comprising a differential ADC having differential input terminals coupled to the first and second output terminals of the differential amplifier of the ramp voltage generator of claim 16.

18. A method for generating a ramped voltage, the method performed in a ramp voltage generator circuit including an output terminal, a current source, a first capacitor, a second capacitor, an offset generation circuit, and an amplifier having a first input and a first output, the method comprising:
    during a first phase having a first configuration of a plurality of switches, charging the first capacitor using the current source;
    during a second phase having a second configuration of the plurality of switches, transferring charge from the first capacitor to the second capacitor such that a change in charge at the second capacitor causes a first predetermined voltage change at the output terminal; and
    during a third phase having a third configuration of the plurality of switches, transferring charge from the offset generation circuit to the second capacitor such that a change in charge at the second capacitor causes a second predetermined voltage change at the output terminal.

19. The method of claim 18, further comprising coupling signals from a test control unit to the plurality of switches to configure the plurality of switches.

* * * * *